United States Patent [19]

Lee et al.

[11] Patent Number: 4,703,965

[45] Date of Patent: Nov. 3, 1987

[54] INTEGRATED CIRCUIT PLACEMENT DEVICE VACUUM HEAD

[75] Inventors: John S. Lee; Daniel L. Lozinski, both of Coon Rapids, Minn.

[73] Assignee: Micro Component Technology, Inc., St. Paul, Minn.

[21] Appl. No.: 833,104

[22] Filed: Feb. 25, 1986

[51] Int. Cl.⁴ .................... B25J 15/06; B65G 47/91
[52] U.S. Cl. ....................................... 294/64.1; 29/743
[58] Field of Search ............... 294/2, 64.1, 65; 29/740, 743, 758; 248/362, 363; 269/21; 271/90, 91, 103; 279/3; 414/72, 121, 627, 737, 744 B, 752; 901/40

[56] References Cited

U.S. PATENT DOCUMENTS

| | | | |
|---|---|---|---|
| 2,789,680 | 4/1957 | Kerr | 414/744 B X |
| 3,695,461 | 10/1972 | Ginther | 294/64.1 X |
| 3,973,682 | 8/1976 | Neff | 414/627 |
| 4,135,630 | 1/1979 | Snyder et al. | 294/64.1 X |
| 4,174,847 | 11/1979 | Wiesler | 279/1 L |
| 4,189,137 | 2/1980 | Denney et al. | 294/64.1 X |
| 4,559,718 | 12/1985 | Tadokoro | 414/744 B X |

FOREIGN PATENT DOCUMENTS 154552 9/1985 European Pat. Off. .............. 29/743
3102206 8/1982 Fed. Rep. of Germany ........ 29/743
1193921 6/1970 United Kingdom ............... 294/64.1

OTHER PUBLICATIONS

IBM Technical Disclosure Bulletin; "Vacuum Foot Separator" by T. Barna; vol. 7, No. 2, Jul. 1964.

Primary Examiner—Johnny D. Cherry
Attorney, Agent, or Firm—Lawrence M. Nawrocki

[57] ABSTRACT

A vacuum head (10) for pick-up and placement of integrated circuit devices (16, 16'). The apparatus includes an outer housing (18) enclosing therewithin an inner tip assembly (34). The inner tip assembly (34) is disposed for reciprocation through and past an orifice (24) formed in a fitting (26) closing one end of the casing (20) of the outer housing (18). The inner tip assembly (34) has formed therein a shoulder (76) which, when the assembly (34) is moved to an extended position, can engage a seat (78) formed in an inner surface of the fitting (26). An O-ring (80) can be interposed between the shoulder (76) and the seat (78) to preclude vacuum generated in vacuum chamber (30) from being directed other than through an orifice (68) formed in the inner tip assembly (34). An air cylinder (48) is provided to actuate the inner tip assembly (34) for movement between retracted and extended positions.

7 Claims, 3 Drawing Figures

INTEGRATED CIRCUIT PLACEMENT DEVICE VACUUM HEAD

TECHNICAL FIELD

The present invention is generally related to the field of assembling circuit boards employing integrated circuit devices. More narrowly, the invention is directed to apparatus for the placement of electronic components on such host structures. The invention specifically deals with apparatus for picking up, holding and placing surface mount integrated circuit components onto printed circuit boards for their soldering thereto.

BACKGROUND OF THE INVENTION

Integrated circuit devices, also known as semi-conductors, are used throughout the electronics industry. The importance of the integrated circuit device resides in its multiple and varied uses. They are typically used in printed circuit boards of various configurations. Because a multiplicity of these integrated circuit devices is, as a matter of course, needed to assemble a printed circuit board, and because location of placement is often critical, means to handle the multiplicity of these devices quickly and accurately is important.

The small size of the integrated circuit device with its fragile leads requires the use of precision and soft-handling instruments to allow for its placement in a particular position on a printed circuit board. Apparatus capable of precise placement are known in the art. The small size of the integrated circuit device, in combination with the small size of the leads extending from the main body portion of the circuit device, increases the need for precise placement in order to insure correct connections be formed between the integrated circuit device and the host printed circuit board on which the device is to be mounted.

Prior apparatus for the placement of such devices have used hollow probes with a connected vacuum source. Such a structure utilizes the hollow probe as a straw-type device which picks up and places the device by application of the vacuum to temporarily hold the integrated circuit device to be mounted to the straw-like device. Once the integrated circuit device is maneuvered to the position at which it is ultimately intended to be mounted, the vacuum is either withdrawn or the integrated circuit device is affixed to the printed circuit board by attachment means. The method of attachment usually involves soldering of the leads to their connections on the printed circuit board.

A problem with this type of prior art structure has been the inflexibility of the vacuum probes to adapt to integrated circuit devices of varying sizes. In the prior art, when integrated circuit devices of a relatively smaller or larger size than the preceding device handled are to be maneuvered, removal of the particular hollow probe previously used and installation of a different hollow probe of a variant size is required before continuing. This process obviously results in time lost in the reconfiguring of the vacuum probe before continuing with the placement of integrated circuit devices of the new size. Apparatus that would provide for automatically adapting an electronic component placement device to fit various sized integrated circuit devices would be an improvement over the prior art. Additionally, apparatus utilizing a common vacuum source with automatically adaptable vacuum probe heads would save time and thus speed up the manufacture of printed circuit boards.

SUMMARY OF THE INVENTION

The present invention is a vacuum head for holding an integrated circuit device of virtually any size for centering on the head prior to the head placing the IC in position at a host circuit board to which the device is to be mounted. The apparatus includes a first housing having a common vacuum chamber formed therewithin. A surface of the housing has an orifice formed therethrough, the orifice being aligned with respect to an axis of the housing. The orifice is intended to be engaged with the device to be mounted to the board, and, when vacuum is induced within the vacuum chamber, the component can be "picked" for placement on the board. A smaller housing is disposed within the common vacuum chamber of the first housing. The disposition of the second housing is such that it is selectively reciprocable between first and second positions. In the first position, a surface of the second housing, having an orifice in fluid communication with the vacuum within the chamber, is retracted within the orifice in the first housing and into the vacuum chamber. In the second position, the surface of the second housing is extended through the orifice of the first housing. When the second housing is in its second position, the vacuum head can be utilized to pick and place smaller integrated circuit devices than would otherwise be able to be manipulated. Integrated circuit devices of virtually any size can, thereby, be accommodated.

In a preferred embodiment of the invention, the first housing is barrel-shaped in form and has an outer tip which defines its orifice. The second housing comprises an inner tip assembly aligned along the axis of the barrel-shaped housing for reciprocation along that axis. Typically, in the preferred embodiment, the surface of the barrel-shaped housing in which its orifice is formed would be perpendicular to the axis.

A seal can be provided to insure that, when the inner tip assembly is projected through the orifice of the barrel housing, vacuum generated within the vacuum chamber is virtually fully applied through the orifice in the inner tip assembly. A seat can be provided on an inner surface of the vacuum chamber circumscribing the orifice of the barrel housing. Similarly, the inner tip assembly can be provided with an annular shoulder engageable with this seat. An O-ring can be interposed between the seat and shoulder so that, as the inner tip assembly is projected to its second position, the O-ring will be engaged by both the seat and shoulder. Vacuum will, therefore, be directed only to the orifice of the inner tip assembly, since that orifice is in fluid communication with the vacuum chamber. Vacuum will be precluded from passing between the seat and the shoulder.

In a preferred structure of practicing the invention, the inner tip assembly can take the form of an inner shaft having an aperture, transverse to the orientation of the axis of the barrel housing, formed therethrough. This aperture would be at a location such that the aperture would be in fluid communication with the vacuum chamber even when the annular shoulder of the inner tip assembly were in engagement with the O-ring seal. A conduit would, in turn, be provided extending between the aperture, and the orifice of the inner tip assembly in order to convey the vacuum to that orifice.

The present invention is, thus, an improved vacuum head device for picking and placing various types and sizes of integrated circuits for mounting to host structures such is printed circuit boards. More specific details and advantages obtained in view of these details will become apparent with reference to the DETAILED DESCRIPTION OF THE INVENTION, appended claims, and accompanying drawing.

DETAILED DESCRIPTION OF THE INVENTION

Figure 1:
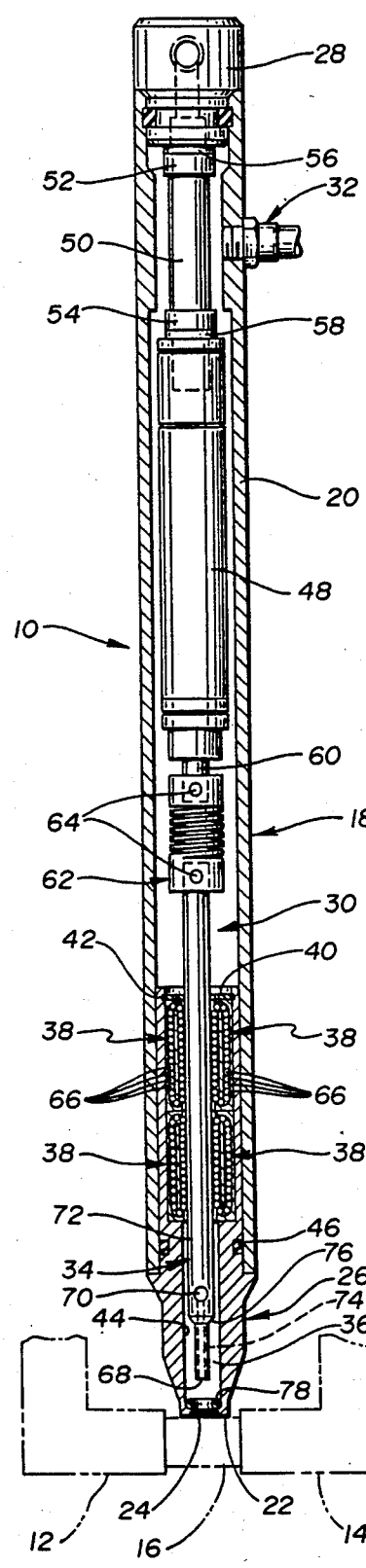
FIG. 1 is a side sectional view of a vacuum head in accordance with the present invention illustrating the inner tip assembly in its first, or retracted, position.
Figure 2:
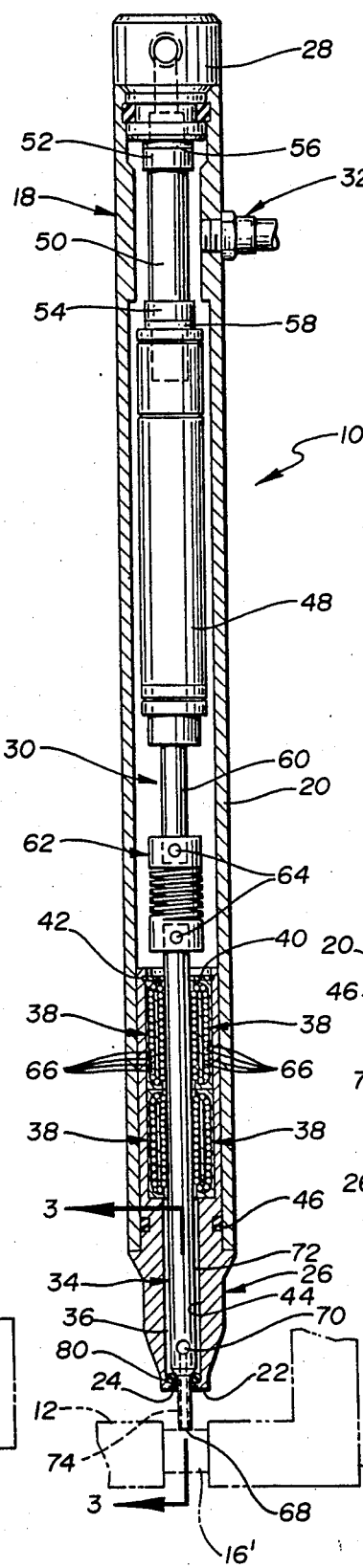
FIG. 2 is a view similar to that of FIG. 1 with the inner tip assembly in its second or extended position.

Referring now to the drawing wherein like reference numerals denote like elements throughout the several views, FIGS. 1 and 2 illustrate a vacuum head 10 in accordance with the present invention. The invention is shown as being used in cooperation with a pair of holding and centering jaws 12, 14 by which an integrated circuit device 16, 16' is centered on the vacuum head 10 with respect to a central longitudinal axis (not shown) thereof. The head 10 comprises an outer housing 18 which has a casing 20 generally circularly cylindrical along much of its length. In operation, the housing 20 would typically be disposed so that the central longitudinal axis thereof was oriented substantially vertically. With such an orientation, a surface 22 of the housing 18 having an orifice 24 therethrough is disposed generally horizontally in a tapered fitting 26 at the lower end of the casing 20.

The casing 20 is closed at its upper end by an end cap 28, the end cap 28 typically being sealed so that vacuum induced within a chamber 30 defined within the casing 20 will not escape upwardly. A vacuum inlet 32 is shown extending into the chamber 30 from the right side of the casing 20.

FIGS. 1 and 2 show an inner tip assembly 34 enclosed within the barrel housing casing 20 in a concentric relationship. The inner tip assembly 34 is intended to be selectively reciprocated along the axis of the outer housing 20 between a first, retracted position, as seen in FIG. 1, and a second, extended position, as seen in FIG. 2. Reciprocation is accomplished in a manner as will be discussed hereinafter.

The lower end of the outer housing 20 is provided with a fitting 26 which carries a surface 22 through which the orifice 24 is formed. The fitting 26 has a channel 36 formed therein, the channel 36 having a diameter slightly larger than that of the the inner tip assembly 34. The fitting 26, at its inner end, can carry a plurality of radially inwardly facing, linear bearings 38 for aligning and disposing the inner tip assembly 34 along the axis of the outer housing 18. Since tolerances with regard to the relationship of the inner tip assembly 34 to the outer housing 18 can be critical, precision components would, typically, be used in mounting the tip assembly 34 relative to the outer housing casing 20.

The fitting 26 could be maintained within the outer housing casing 20 in any appropriate manner. Similarly, any appropriate method or structure for maintaining the linear bearings 38 in place could be employed. The figures illustrate a C-ring 40 fitted into an annular groove 42 formed in the inner surface 44 of the fitting 26. The figures illustrate employment of an O-ring seal 46 between the fitting 26 and the lower end of the outer housing casing 20 to ensure containment of the vacuum generated within the casing 20 at the interface of these two members.

As previously discussed, the inner tip assembly 34 is disposed for reciprocation between retracted and extended positions. An air cylinder 48 is utilized for this purpose. The cylinder 48 is located within the outer housing casing 20 at a position intermediate the inner tip assembly 34 and the upper end cap 28. The cylinder 48 is suspended from the upper end cap 28 by an extension conduit 50 by which the air is provided to the cylinder 48. It is envisioned that this conduit 50 be made of an appropriate metal. Consequently, the positioning of the cylinder 48 relative to the casing 20 would be relatively stable, since fittings 52, 54 by which the conduit 50 is mounted to the end cap 28 and the cylinder 48 provide relative rigidity.

The fittings 52, 54 can be sealed by appropriate elastomeric gaskets 56, 58. Consequently, air for actuating the cylinder 48 should not leak into the chamber 30 in which a vacuum is to be induced.

A reciprocable shaft 60 extending downwardly from the cylinder 48 is coupled to the inner tip assembly 34. Although the positioning of the air cylinder 48 within the outer housing casing 20 is relatively fixed, some flexure of the extension conduit 50 might occur as air is introduced into, and bled from, the air cylinder 48. As a result, the coupling mechanism by which mating of the air cylinder shaft 60 to the inner tip assembly 34 is accomplished would, it is envisioned, be flexible, since the inner tip assembly 34 is, as previously indicated, rigidly spaced relative to the outer housing casing 20. Any appropriate flexible coupling 62 could be employed. The one illustrated is mated to the air cylinder shaft 60 at one of its ends and to the inner tip assembly 34 at its other end. Mating can be effected by use of set screws 64 or other appropriate means.

In operation, a pick and place apparatus employing the vacuum head 10 in accordance with the present invention would bring the vacuum head 10 into engagement with integrated circuit device 16, 16' to be mounted to a structure such as a printed circuit board (not shown). If the IC device 16, 16' is relatively large in size (for example, larger than 0.125 inches square), the larger orifice 24 formed in the fitting 26 of the outer housing 18 could be employed. Air would be provided to the cylinder 48 to operate the piston thereof (not shown) so that the inner tip assembly 34 would be retracted into its first position.

With the inner tip assembly 34 in this position, vacuum would be induced within the chamber 30 within the outer housing 18. The vacuum would pass downwardly from the vacuum inlet 32, through an annular space enclosing the air cylinder 48, and through spaces between ball bushings 66 comprising the linear bearings 38. The vacuum would, thereafter, pass around the lower end of the inner tip assembly 34 and to the orifice 24 formed in the fitting 26. When that orifice 24 was brought into engagement with an IC component 16, 16', the component 16, 16' would be held in place against the orifice 24.

As can be seen in view of this disclosure, all vacuum generated will be directed to the orifice 24 in the fitting 26. Maximum efficiency will, thereby, be achieved.

With the component 16, 16' held at the orifice 24, the jaws 12, 14 of the centering structure can be synchronously operated to close upon the IC device 16, 16' to center it with respect to the axis of the vacuum head 10. As will be able to be seen, the centering illustrated in the figures would occur only along one axis. If desired, a second pair of jaws (not shown) could be incorporated to center the device along an axis perpendicular to the one along which the jaws 12, 14 illustrated so center.

When smaller integrated circuit devices (for example, ones having dimensions less than 0.250 inches square) are to be placed, the air cylinder 48 can be operated to extend the shaft 60 and, in turn, extend the inner tip assembly 34 so that its lower, distal end will be projected through the orifice 24 in the outer casing fitting 26. As the vacuum head 10 is lowered into a position to engage a component 16, 16', the device 16, 16' will be engaged by the inner tip assembly 34 rather than the outer housing fitting 26.

Figure 3:
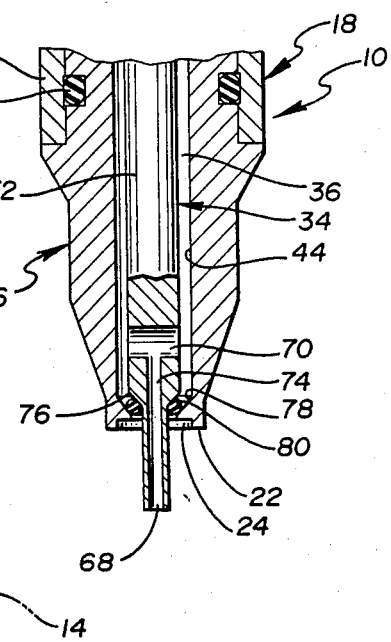
FIG. 3 is an enlarged sectional detail view taken generally along the line 3—3 of FIG. 2.

Referring now to FIG. 3, the specific construction of the inner tip assembly 34 is one wherein fluid communication is provided between the vacuum chamber 30 and an orifice 68 at the distal end of the assembly 34. A transverse aperture 70 is formed through a solid inner shaft 72 of the inner tip assembly 34 and, immediately, communicates with the vacuum chamber 30. A conduit 74 extends downwardly from the aperture 70 to the orifice 68 of the inner tip assembly 34.

The inner shaft 72 is provided with an oblique, annular shoulder 76. This shoulder 76 faces axially downwardly. Similarly, a seat 78 is provided within the vacuum chamber 30 circumscribing the orifice 24 in the fitting 26 of the outer housing 18. This shoulder 76 and seat 78 are engagable as the inner tip assembly 34 is actuated in movement to its extended position. An O-ring 80 is interposed between the shoulder 76 and seat 78 and positioned on the seat 78 so that, as the inner tip assembly 34 arrives at its second, extended position, the O-ring 80 will be engaged by both the seat 78 and the shoulder 76. Vacuum will, therefore, be precluded from passing other than through the inner tip assembly 34 to the orifice 68 at the distal end thereof.

As will be seen in view of this disclosure, when the inner tip assembly 34 is in its retracted position, vacuum will leak between the outer housing fitting 26 and the inner tip assembly 34. Still, all of the vacuum will be applied through the orifice 24 in the fitting 26. Such leaking will, of course, be undesirable, when the inner tip assembly 34 is extended. Because of the structural configuration illustrated in the drawing, however, leakage is precluded.

The present invention, thus, is a versatile vacuum head 10 for accomplishing its intended purpose. Tips can be "changed" rapidly, efficiently, and without sacrificing alignment of the vacuum orifice 24, 68. Further, interruption of placement operations is extremely minimal.

Numerous characteristics and advantages of this invention have been set forth in the foregoing description. It will be understood, however, that this disclosure is in many respects illustrative only. Changes may be made in details, particularly in matters of shape, size and arrangement of parts without exceeding the scope of this invention. The scope of the invention is defined in the language in which the appended claims are expressed.

What is claimed is:

1. Appparatus for holding one of a number of differently sized integrated circuit devices for placement of the device on a host structure to which it is to be mounted after centering of the device on said apparatus, comprising:

(a) a superior housing defining a common vacuum chamber, said housing having a superior orifice, aligned with repect to an axis of said housing, formed in a surface of said housing and disposed for engagement with the device to hold the device for centering and placement, said vacuum chamber having an axially inwardly facing annular seat circumscribing said superior orifice;

(b) an inferior housing, having an inferior orifice formed in a surface thereof, defining an axially outwardly facing annular shoulder engagable with said vacuum chamber seat, said inferior housing being disposed within said common vacuum chamber and being selectively reciprocable between a first position, wherein said surface of said inferior housing is retracted within said common vacuum chamber, and a second position, wherein said surface of said inferior housing is extended through said superior orifice, said inferior orifice being in fluid communication with said vacuum chamber, and said inferior orifice being disposed, when said inferior housing is in said second position, for engagement with a smaller integrated circuit device to hold such as smaller device for centering and placement; and (c) sealing means, receivable between said shoulder and said seat, to preclude escape of vacuum generated, other than through said inferior orifice when said inferior housing is in said second position.

2. The apparatus of claim 1 further comprising means for generating a vacuum within said chamber.

3. The apparatus of claim 2 wherein said surface of said superior housing is orthogonal to said axis.

4. The apparatus of claim 3 wherein said inferior housing is disposed for reciprocation along said axis.

5. The apparatus of claim 4 wherein said superior housing comprises a barrel having an outer tip in which said superior orifice is formed, and wherein said inferior housing comprises an inner tip assembly.

6. The apparatus of claim 5 wherein said inner tip assembly has a conduit formed therein to provide fluid communication, when said inferior housing, is in said second position, between said inferior orifice and said vacuum chamber.

7. Apparatus for holding one of a number of differently sized integrated circuit devices for placement of the device on a host structure to which it is to be mounted after centering of the device on said apparatus, comprising:

(a) a superior housing defining a chamber there within, said housing having a superior orifice, aligned with respect to an axis of said housing, formed in a surface of said housing and disposed for engagement with the device to hold the device for centering and placement;

(b) means for generating a vacuum within said chamber; and (c) an inferior housing, having an inferior orifice formed in a surface thereof, disposed within said chamber and being selectively reciprocable between a first position, wherein said surface of said inferior housing is retracted within said chamber, and a second position, wherein said surface of said inferior housing is extended through said superior orifice, said inferior orifice being in fluid communication with said chamber so that vacuum generated therein can be operative at said inferior orifice, and said inferior orifice being disposed, when said inferior housing is in said second position, for engagement with a smaller integrated circuit device to hold such a smaller device for centering and placement.

* * * * *